US010917997B2

(12) United States Patent
Zardkoohi et al.

(10) Patent No.: US 10,917,997 B2
(45) Date of Patent: Feb. 9, 2021

(54) DRIVE CAGE PANELS TO DIVERT FLOWS OF AIR

(71) Applicant: HEWLETT PACKARD ENTERPRISE DEVELOPMENT LP, Houston, TX (US)

(72) Inventors: Khosrow Zardkoohi, Fremont, CA (US); Herbert J. Tanzer, Woodland Park, CO (US); Reino E. Hautala, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/070,892

(22) PCT Filed: Jan. 19, 2016

(86) PCT No.: PCT/US2016/013853
§ 371 (c)(1),
(2) Date: Jul. 18, 2018

(87) PCT Pub. No.: WO2017/127046
PCT Pub. Date: Jul. 27, 2017

(65) Prior Publication Data
US 2019/0029145 A1    Jan. 24, 2019

(51) Int. Cl.
*H05K 7/20* (2006.01)
*G11B 33/14* (2006.01)
*G11B 33/12* (2006.01)
*G06F 1/18* (2006.01)
*G06F 1/20* (2006.01)
*G06F 1/16* (2006.01)

(52) U.S. Cl.
CPC ........... *H05K 7/20736* (2013.01); *G06F 1/16* (2013.01); *G06F 1/181* (2013.01); *G06F 1/187* (2013.01); *G06F 1/20* (2013.01); *G11B 33/128* (2013.01); *G11B 33/142* (2013.01); *H05K 7/20727* (2013.01)

(58) Field of Classification Search
CPC ........... H05K 7/20736; H05K 7/20145; H05K 7/20727
USPC .............................. 361/679.33, 679.51, 695
See application file for complete search history.

(56) References Cited

U.S. PATENT DOCUMENTS 5,912,799 A    6/1999 Grouell et al.
5,914,858 A    6/1999 McKeen et al.
(Continued)

OTHER PUBLICATIONS

Digital Storm, "Intelligent Airflow Control," copyright 2015, http://www.digitalstorm.com/bolt-3.asp.
(Continued)

*Primary Examiner* — Mukundbhai G Patel
(74) *Attorney, Agent, or Firm* — Wall and Tong, LLP (57) ABSTRACT

Example drive cage panels for drive cages are disclosed. For example, a drive cage panel for a drive cage may include a plurality of air inlet holes in a front face of the drive cage panel, a plurality of air guides through a surface of the drive cage panel, the plurality of air guides aligned with a drive region of the drive cage, and an air baffle. In one example, the air baffle is to divert a flow of air from the plurality of air inlet holes to the drive region via the plurality of air guides when deployed on the surface of the drive cage panel.

17 Claims, 3 Drawing Sheets

(56) References Cited

U.S. PATENT DOCUMENTS

| | | | |
|---|---|---|---|
| 6,975,510 B1 * | 12/2005 | Robbins | H05K 7/20563 312/223.2 |
| 7,508,663 B2 | 3/2009 | Coglitore et al. | |
| 7,675,750 B1 | 3/2010 | Tamarkin | |
| 7,952,869 B2 | 5/2011 | Richard et al. | |
| 7,957,133 B2 * | 6/2011 | Zieman | G06F 1/20 312/236 |
| 8,939,824 B1 | 1/2015 | Bash et al. | |
| 2005/0157467 A1 | 7/2005 | Malone et al. | |
| 2007/0247805 A1 | 10/2007 | Fujie et al. | |
| 2011/0081851 A1 | 4/2011 | Franz et al. | |

OTHER PUBLICATIONS

International Search Report & Written Opinion received in PCT Application No. PCT/US2016/013853, dated Oct. 5, 2016, 11 pages.

\* cited by examiner

DRIVE CAGE PANELS TO DIVERT FLOWS OF AIR

BACKGROUND

A storage chassis may accommodate a plurality of drive assemblies. Each of the plurality of drive assemblies may comprise a drive such as a hard disk drive (HDD) disposed within a drive carrier. The drive assemblies may be installed in a drive cage, the drive cage may be installed in the chassis, and the chassis may be installed in a rack.

DETAILED DESCRIPTION

In one example, a drive cage panel for a drive cage is described. For example, the drive cage panel may include a plurality of air inlet holes in a front face of the drive cage panel, a plurality of air guides through a surface of the drive cage panel, the plurality of air guides aligned with a drive region of the drive cage, and an air baffle. In one example, the air baffle is to divert a flow of air from the plurality of air inlet holes to the drive region via the plurality of air guides when deployed on the surface of the drive cage panel.

In another example, a drive cage is described. For example, the drive cage may include a first panel and a second panel parallel to the first panel. In one example, the first panel may include a first plurality of air inlet holes in a front face of the first panel, a first plurality of air guides through a surface of the first panel, the first plurality of air guides aligned with a drive region of the drive cage, and a first air baffle, the first air baffle to divert a first flow of air from the first plurality of air inlet holes to the drive region via the first plurality of air guides when deployed on the surface of the first panel. In one example, the second panel may include a second plurality of air inlet holes in a front face of the second panel, a second plurality of air guides through a surface of the second panel, the second plurality of air guides aligned with the drive region of the drive cage, and a second air baffle, the second air baffle to divert a second flow of air from the second plurality of air inlet holes to the drive region via the second plurality of air guides when deployed on the surface of the second panel.

In another example, a chassis is described. For instance, the chassis may include a backplane and at least one drive cage, the at least one drive cage for supporting a plurality of drive carriers and comprising at least one panel. In one example, the at least one panel may include a plurality of air inlet holes in a front face of the at least one panel, a plurality of air guides through a surface of the at least one panel, the plurality of air guides aligned with a drive region of the at least one drive cage, and a removable air baffle to divert a flow of air from the plurality of air inlet holes to the drive region via the plurality of air guides when deployed on the surface of the at least one panel and to pass the flow of air to the backplane when the removable air baffle is not deployed on the surface of the at least one panel.

A storage enclosure, such as a drive cage or a blade enclosure, may include disks and drives, such as hard disk drives (HDDs), solid state drives (SSDs), board-mounted flash modules, or other storage devices, mounted in drive carriers and arranged in various configurations, such as "just a bunch of disks" (JBODs), flashBODs, a redundant array of independent disks (RAID), and so forth. The drive carriers provide a number of features, including: handling and hot swap-ability, shock and vibration protection, rotational vibration interference (RVI) control, air flow paths for cooling, electromagnetic interference (EMI) emissions attenuations, and electrical grounding control. The drive cage may be one of a plurality of drive cages that is deployed in a chassis. In addition, the chassis may be deployed in a rack.

To meet increased data processing and data storage goals, one may include as many drives and other components in each enclosure, rack, chassis, and data center as possible. Drives and drive carriers may be designed and optimized for use in 2.5 inch bays, 3.5 inch bays, and so forth (where, the inch size is in reference to the historical disk size used in the bay, and is not representative of the actual bay cross-sectional dimensions). However, dense packing of drives and other components leads to heat dissipation issues, which are addressed in various ways, such as by maintaining a low ambient temperature within a data center, through the use of fans, liquid cooling, and so forth.

In one example, the present disclosure includes a drive cage with removable air baffles to tune airflow paths for different system configurations within a chassis. For instance, the drive cage may comprise two spaced-apart parallel panels, each panel with rows of parallel guides protruding from a surface of the panel to support drive carriers and/or to define bays/slots within the drive cage. Each panel may include a front face with a plurality of air inlet holes. The front face may be at approximately 90 degrees from the surface of the panel that includes the guides, and may be formed integrally with the surface. For example, the panels may be comprised of sheet metal, such as galvanized steel, aluminum, or the like that is punched, pressed, stamped, bent, and so forth, to form a final shape. In one example, air guides may be formed from at least some of the guides of a panel of the drive cage. For instance, as mentioned above, a guide may comprise an elongated protrusion or ridge that stands out from a surface of the panel to support a drive carrier. Accordingly, in one example, an air guide may be formed by removing a portion of the ridge to create an elongated opening in the panel. In one example, the air guides may be aligned with a drive region of the drive cage. In one example, a removable air baffle may be deployed on the surface of a panel to divert a flow of air from the plurality of air inlet holes in the front face to the drive region. For instance, the air baffle may be placed adjacent to a column of air guides (and behind the column of air guides with respect to a direction of airflow from the plurality of air inlet holes in the front face of the panel towards a rear of the panel/rear of the drive cage). However, the drive cage may also be used without such an air baffle. In such case, a flow of air from the plurality of air inlet holes in the front face may pass to a rear of the panel/rear of the drive cage without passing through the drive region in the interior of the drive cage.

Thus, the example drive cages and panels of the present disclosure may be used to tune airflow cooling for various system configurations within a chassis. To illustrate, the drive cage may be used in connection with a disk array, e.g., in a JBOD configuration, a RAID configuration, etc. In this case, the disks may connect to a backplane/midplane, e.g., a printed circuit board with busses and other electrical routing. The backplane may be located towards a rear of the drive cage, and may separate the drive cage, drive carriers, and drives from the rear of the chassis. The rear of the chassis may not include significant heat generating components. For instance, the rear of the chassis may include input/output (I/O) modules coupled to the backplane, which generate some heat, but which are not usually significant for heat dissipation purposes, e.g., typically outputting 20-80 watts or less. The rear of the chassis may also include power supplies, fan modules, and so on, which may also not be considered as significant sources of heat.

In contrast, in a typical disk array configuration, the more significant heat generating components may comprise the disk drives that are housed within drive carriers and within a drive cage. For instance, a Serial Attached Small Component Serial Interface (SCSI)/(SAS) disk drive may operate at approximately 10-15 watts. The latest high power drives, such as small form factor Peripheral Component Interface express (PCIe) solid state drives (SSDs), may output up to 25 watts or more. In addition, several of such drives may be installed adjacent to one another within a drive cage. For example, in a drive cage with 24 drives outputting at 25 watts or more each, the total output may be 600 watts or more. As such, a drive cage of the present disclosure, when used in connection with chassis containing a disk array system, may be deployed with drive cage panels including the removable air baffles deployed in the surfaces of the panels. The air baffles may divert respective air flows from the plurality of air inlet holes in the front faces of the respective panels into an air plenum and/or a drive region within the drive cage. In other words, the air that passes through the plurality of air inlet holes in the front faces of the respective panels may be directed primarily to the relatively higher heat generating drives, rather than to a rear of the panels/rear of the drive cage and towards components in the rear of the chassis.

In another example, the same example drive cage may be used in connection with an integrated drive configuration, e.g., with one or more controller nodes in the rear of the chassis. The configuration is referred to as "integrated" insofar as the system includes disk array functionality and controller functionality. For example, drives may plug-in to ports on a surface of a backplane/midplane facing the front of the enclosure. Controller node(s) may be connected/coupled to an opposite face of the backplane in the rear of the chassis. In such a configuration, the controller node(s), including application specific integrated circuits (ASICs), central processing units (CPUs), and so forth, may comprise relatively more significant heat sources as compared to the drives contained within the drive cage. For instance, if 10-12 watt drives are utilized, the controller nodes may comprise relatively greater sources of heat. For instance, the controller nodes may generate from 100-1000 watts or more. Other components, such as I/O modules, power supplies, fan modules, and so on may also be located in the rear of the chassis and may have various heat outputs, but the primary heat source(s) remain with the controller node(s).

As such, a drive cage of the present disclosure, when used in connection with a chassis containing an integrated drive system, may be deployed with drive cage panels having the removable air baffles removed from the surfaces of the panels. In other words, respective air flows from the plurality of air inlet holes in the front faces of the respective panels may pass primarily to the rear of the panels/rear of the drive cage, and towards the components in the rear of the chassis. The air flows will primarily not pass through the drive region in the center of the drive cage. Accordingly, relatively more cooling air from the air flows from the plurality of air inlet holes in the front faces of the respective panels may be directed to the controller node(s) and/or other heat generating components in the rear of the chassis.

Thus, based on the power dissipation levels in the disks, I/O modules, controller node(s), and/or other components, the example drive cages of the present disclosure may tune the airflow for different regions of the overall air path from a front of a chassis to a rear of the chassis. As such, a common enclosure can be used for a number of different system configurations. In this regard, it should be noted that the foregoing examples are just two illustrative examples of system configurations for which a drive cage and/or the panels of a drive cage may be tuned for air flow optimization. In addition, an example drive cage of the present disclosure can be retrofitted into existing chassis designs, and can be used with current and new/upgraded drives and other electronics. These and other aspects of the present disclosure are discussed in greater detail below in connection with the example FIGS. 1-3.

Figure 1:
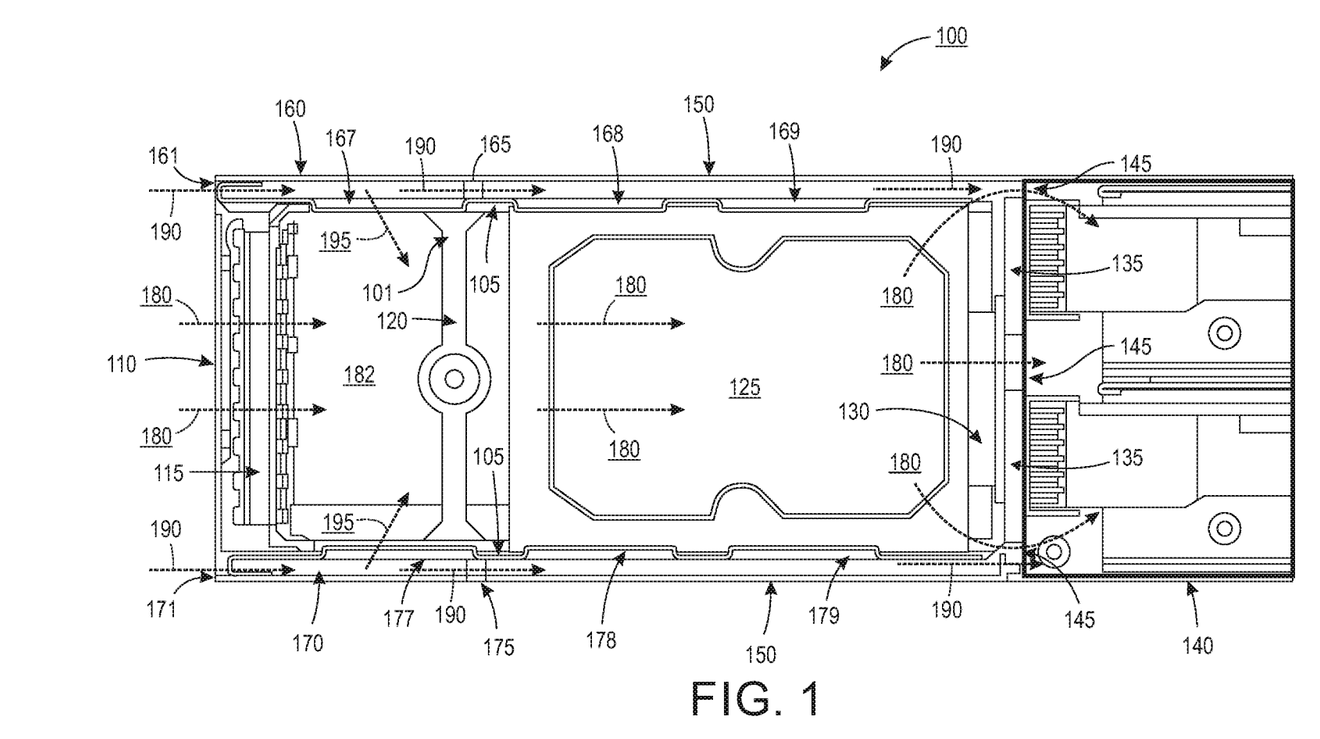
FIG. 1 illustrates a portion of an example chassis, including an example drive cage with example removable air baffles for airflow adjustability, and a drive carrier.

Referring now to FIG. 1, a portion of an example chassis 100 is illustrated. Chassis 100 may include a drive cage 150 having a first panel 160 and a second panel 170. Chassis 100 may further include a backplane 135 and one or more modules 140 located to the rear of the chassis 100. One or more drive carriers may be installed in drive cage 15a For illustrative purposes, a drive carrier 101 is shown in FIG. 1. Drive carrier 101 may include a housing 105, which may include a support bar 120, a bezel 110, and an electromagnetic interference (EMI) shield 115. As illustrated in FIG. 1, the drive carrier 101 houses a drive 125 within the housing 105. The drive 125 may be electrically and physically coupled to the backplane 135 via a connector 130. Depending upon the particular system configuration, the one or more modules 140 may also connect to the backplane 135. In one example, the backplane 135 may be a quarter inch thick or less and may be oriented perpendicular to the drive 125 and drive carrier 101 (and perpendicular to any other drive or drive carrier that is installed in the drive cage 150).

The first panel 160 and second panel 170 of the drive cage 150 may include front faces 161 and 171, and guides 167-169 and guides 177-179, respectively. The front faces 161 and 171 may include air inlet holes (not shown). The rear portions of first panel 160 and second panel 170 may be aligned to the backplane 135. The guides 167-169 and guides 177-179 may comprise elongated ridges protruding from surfaces of the first panel 160 and the second panel 170, and may be arranged in rows from the front of the drive cage 101 (near the bezel 110) to the rear of the drive cage (near the backplane 135). The guides 167-169 and guides 177-179 may be aligned with a drive region 182 of the drive cage 150. Due to the side-on view, the surfaces of the first panel 160 and the second panel 170 are not visible in FIG. 1. In addition, each of the first panel 160 and second panel 170 may include a plurality of parallel rows of guides, forming a number of slots or bays in the drive cage 15a For instance, drive carrier 101 may be installed within a bay of the drive cage 150. In one example, the housing 105 of drive carrier 101 may be supported by the guides 167-169 and guides 177-179 respectively. For instance, guides 167-169 and guides 177-179 may overlap with housing 105 such that the drive carrier 101 will not impinge upon a drive carrier in a slot below (e.g., in a direction into or out of the page within respect to the orientation of FIG. 1).

In the absence of a drive cage of the present disclosure, in one example cooling air may flow through chassis 100 as follows. A fan, e.g., in the one or more modules 140, or elsewhere in a rack, may generate an airflow from a front of the chassis 100 towards the rear. This may be represented by the arrows 180. The air in the airflow may be drawn through openings in the bezel 110 and EMI shield 115 into a drive region 182, e.g., into an air plenum of the interior of the drive cage 150. The air in the airflow (again indicated by arrows 180) may pass over the drive 125 and then may pass through several openings 145 in the backplane 135 toward the one or more modules 140 in the rear of the chassis 100. Thus, the air in the airflow indicated by arrows 180 may be used to cool both the drive 125 and the one or more modules 140. However, the air may be warmed by the drive 125 before passing through openings 145 in the backplane 135 and reaching the one or more modules 140.

In accordance with the present disclosure, drive cage 150 may include air inlet holes in the front faces 161 and 171 of the first panel 160 and second panel 170, respectively. The air inlet holes provide an additional airflow path from a front of the chassis 100 and/or a front of the drive cage 150 to components in the rear of the chassis 100. For instance, respective airflow paths (indicated by arrows 190) via the first panel 160 and second panel 170 may deliver air from the air inlet holes in the front faces 161 and 171 to the rears of the respective panels and to the backplane 135, e.g., without passing over the drive 125 in the drive region 182. The air in the airflow paths indicated by arrows 190 may then pass through openings 145 toward the one or more modules 140. The air in the airflow paths indicated by arrows 190 may therefore reach the one or more modules 140 without having passed over drive 125. This arrangement of drive cage 150 may be used where the chassis 100 houses an integrated drive configuration and/or where the one or more modules 140 may include controller nodes, for example, or other relatively more significant heat generating components as compared to the drive 125 and/or compared to an array of drives in the drive cage 150.

In addition, in one example the first panel 160 and second panel 170 may include removable air baffles 165 and 175. When the air baffles 165 and 175 are removed from the surfaces of first panel 160 and second panel 170 respectively, cooling air may be delivered from the air inlet holes in the front faces 161 and 171 to the backplane 135 and to the one or more modules 140 as indicated by arrows 190, without entering the drive region 182. However, when the air baffles 165 and 175 are deployed on the surfaces of the first panel 160 and the second panel 170, respectively, the cooling air may be diverted into the air plenum/drive region 182 in the interior of the drive cage 150 as indicated by arrows 195. For instance, in one example, the guides 167 and 177 may comprise "air guides." In other words, the guides 167 and 177 may comprise openings in the surfaces of the first panel 160 and second panel 170 respectively, such that air from the air inlet holes in the front faces 161 and 171 may pass into the drive region 182 in the interior of the drive cage 150 as indicated by arrows 195. The air in the diverted airflow paths indicated by arrows 195 may then join the airflow paths indicated by arrows 180 and may pass over drive 125, through openings 145 in backplane 130, and onward toward the one or more modules 140 in the rear of the chassis 100. For instance, this arrangement of drive cage 150 may be used where the drive 125 (and/or one or more other drives in the drive cage 150) may comprise a significant heat generating component, e.g., a PCIe SSD at 20-25 watts output or greater.

It should be noted that chassis 100 is illustrated in one example representation in FIG. 1, and that chassis 100, drive cage 150, first panel 160, second panel 170, drive carrier 101, and other components may take a variety of other forms. For instance, more or less guides may be provided on the first panel 160 and/or second panel 170. In addition, openings 145 in the backplane 135 may be placed in various locations, e.g., depending upon the particular electrical routing configurations of busses, power supply and ground connections, and so forth. For example, chassis enclosure walls, front and rear panels, fans, power supply cables, and so forth are omitted from FIG. 1. In another example, the drive cage 150 may comprise one of a plurality of drive cages within the chassis 100. Thus, for example, a drive cage 150 may be configured for use with a drive array, while a second drive cage within the drive chassis may be configured for use with an integrated drive configuration. In addition, various other sets of drive cage configurations may be used for various other system configurations which may all be contained within the chassis 100. In addition, it should be noted that various components of chassis 100, drive cage 150, drive carrier 101, and other components are omitted from FIG. 1 for illustrative purposes. Thus, these and other examples are all contemplated within the scope of the present disclosure.

Figure 2:
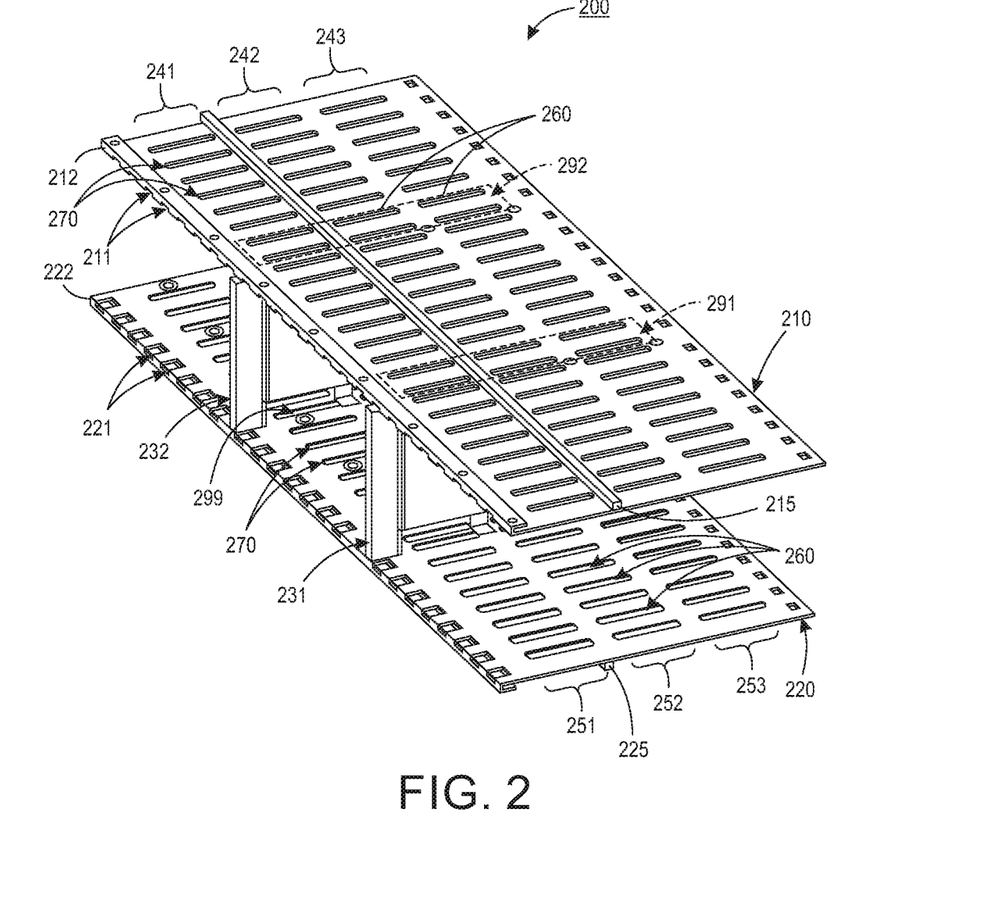
FIG. 2 illustrates a portion of an example drive cage for supporting a plurality or drive carriers, the drive cage including example panels with removable air baffles for airflow adjustability.

FIG. 2 illustrates a portion of an example drive cage 200 for supporting a plurality or drive carriers. The drive cage 200 may comprise the same or a substantially similar component to the drive cage 150 of FIG. 1. As illustrated in FIG. 2, drive cage 200 may include panels 210 and 220 which are spaced apart and parallel to one another. Drive cage 200 may include a first support 231 and a second support 232 to support the panels 210 and 220. Panels 210 and 220 may include front faces 212 and 222, respectively. Front faces 212 and 222 may include a plurality of air inlet holes 211 and 221, respectively. In one example, the air inlet holes 211 and 221 may comprise square or rectangular holes. In another example, the air inlet holes 211 and 221 may have a different pattern, such as circular or oval openings, triangular openings, combinations of any such types of openings, and so on.

In one example, panels 210 and 220 may include a plurality of closed guides 260 and a plurality of open guides 270 (also referred to as "air guides") on the surfaces of the respective panels. The closed guides 260 and a plurality of open guides 270 may be arranged in columns that may extend parallel to the front faces 212 and 222 of the panels 210 and 220. For example, panel 210 may include open guides 270 in a first column 241, and closed guides 260 in a second column 242 and a third column 243. Similarly, pan& 220 may include open guides 270 in a first column 251, and closed guides 260 in a second column 252 and a third column 253. Rows of the guides (including closed guides 270 and open guides 260) may define bays/slots in the drive cage 200. For instance, a first row 291 and a second row 292 are illustrated in FIG. 2.

Example panels 210 and 220 may further include example removable air baffles 215 and 225, respectively, for airflow adjustability. For instance, with the air baffles 215 and 225 deployed on the surfaces of the panels 210 and 220, air flowing through the air inlet holes 211 and 221 toward a rear of the drive cage 200 may be diverted through the open guides 270 to the drive region 299 between the panels 210 and 220 where the drives 231 and 232 are located. However, when the air baffles 215 and 225 are removed from the surfaces of the panels 210 and 220, air flowing through the air inlet holes 211 and 221 may be passed to a rear of the panels 210 and 220 and/or to a rear of the drive cage 200, e.g., without passing into the drive region 299. It should be noted that in one example, the open guides 270 are not physically blocked, but may remain "open." Thus, at least some air flowing through the air inlet holes 211 and 221 may pass into the drive region 299. Nevertheless, due to the velocity of the air entering the air inlet holes 211 and 221 and being drawn towards the rear of the drive cage 200, the air may primarily flow toward the rear of the drive cage 200 without being drawn through the open guides 270.

It should be noted that drive cage 200 is illustrated in one example representation in FIG. 2, and that an example drive cage may take a variety of other forms in accordance with the present disclosure. For instance, in one example, air inlet holes may be omitted from one of the panels 210 or 220. In one example, more or less rows and/or columns of guides may be provided on the panels 210 and 220. In addition, more columns of open guides, and more or less columns of closed guides may be included in other examples of the present disclosure. Alternatively, or in addition, the deployed positions of air baffles 215 and 225 can be varied. For example, air baffles 215 and 225 may be deployed behind and/or adjacent to columns 242 and 252, respectively (e.g., between columns 242 and 243, and between columns 252 and 253). Thus, for example, the air baffles 215 and 225 may divert the flow of air from the plurality of air inlet holes 211 and 221 to a first portion of the drive region 299 when deployed on the surfaces of the panels 210 and 220 adjacent to a respective first pair of columns (e.g., columns 241 and 251), or may divert the flow of air from the plurality of air inlet holes 211 and 221 to a second portion of the drive region 299 when deployed on the surface of the panels 210 and 220 adjacent to a respective second pair of columns (e.g., columns 242 and 252). In various other examples, the open and closed guides may be further modified in position or size. In addition, it should be noted that various components of drive cage 200, such as additional panels, mounting screws, and so forth, are omitted from FIG. 2 for illustrative purposes.

Figure 3:
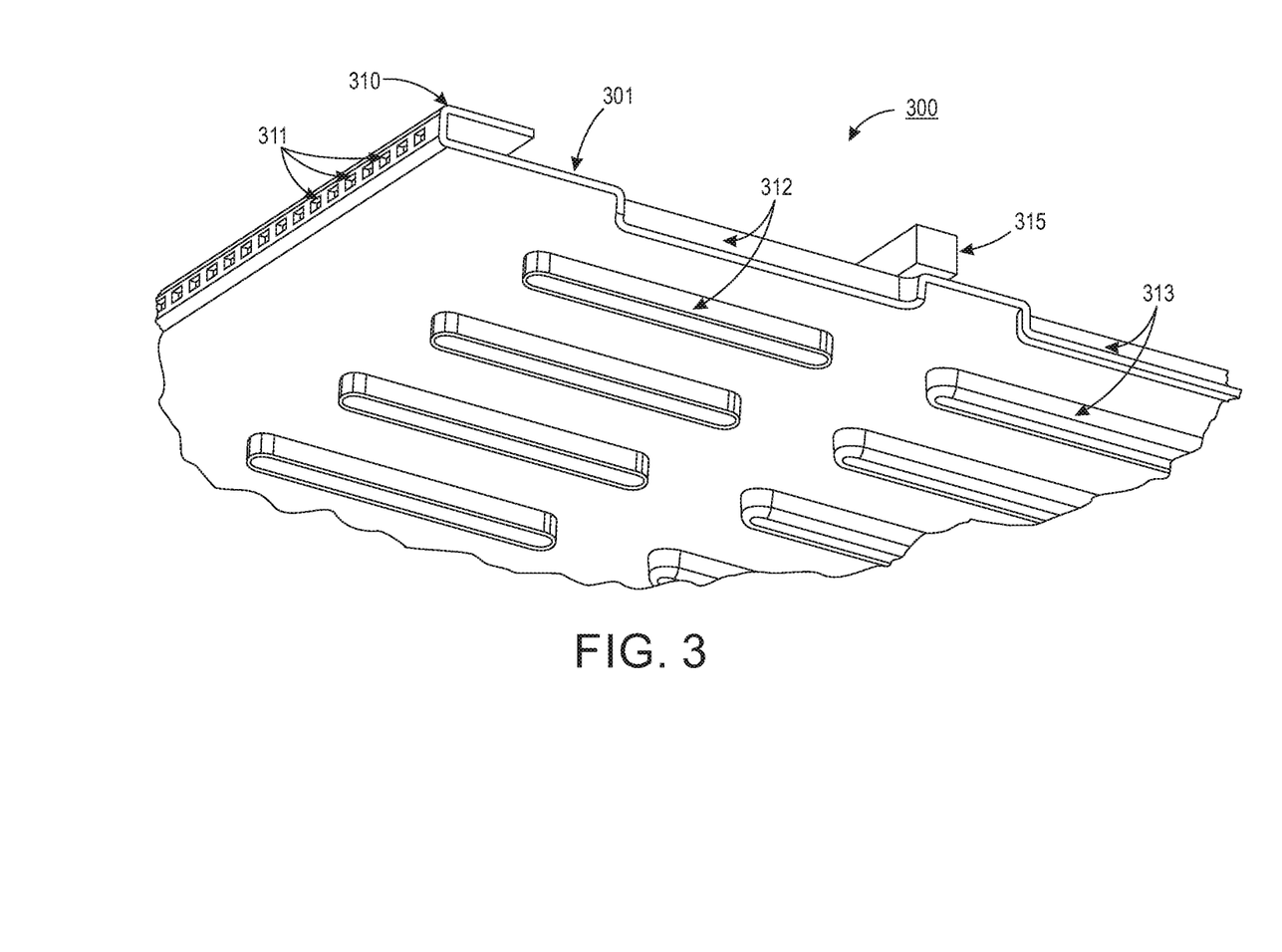
FIG. 3 illustrates a portion of an example drive cage panel with example open and closed guides, and an example removable air baffle.

To further aid in understanding the present disclosure, FIG. 3 illustrates a portion of an example panel (e.g., a drive cage panel) 300 in greater detail. For instance, panel 300 may comprise a same or a substantially similar component as first panel 160 or second panel 170 in FIG. 1, or panels 210 or 220 in FIG. 2. In one example, panel 300 may include a surface 301 with a plurality of guides protruding from the surface 301. For instance, surface 301 may include a plurality of open guides 312, or "air guides," and a plurality of closed guides 313. The open guides 312 may be arranged in a first column, while the closed guides 313 may be arranged in a second column. Panel 300 may include a front face 310 including a plurality of air inlet holes 311. Front face 310 may be formed integral with the surface 301. For example, panel 300 may be comprised of sheet metal, such as galvanized steel, aluminum, or the like. For instance, the panel 300 may be bent to define the surface 301 and the front panel 310, may be pressed to define the guides (including open guides 312 and closed guides 313), may be punched or stamped to define the air inlet holes 311 and the openings of the open guides 312, and so forth. In the example of FIG. 3, air inlet holes 311 are illustrated as having a square shape of uniform size and with uniform spacing. However, in other, further, and different examples, air inlet holes 311 may have a different form, such as rectangular, circular, oval or triangular openings, or any combination of such types of patterns. In addition, in one example the air inlet holes 311 may be different sizes and/or may have non-uniform spacing within the same example panel 300.

Panel 300 may further include a removable air baffle 315 for selectively diverting air flowing from the air inlet holes 311 toward a rear of the panel 300. For instance, when deployed on the surface 301, air baffle 315 may divert the air flow to the open guides 312. In one example, the air baffle may comprise a solid material, such as a metallic rod. In another example, the air baffle 315 may comprise the same or a similar material to the surface 301 of the panel 300. For instance, the air baffle 315 may comprise sheet metal bent into a tube with a square cross section, or other cross section. In still another example, air baffle 315 may comprise a cellular material, such as closed cell foam, e.g., neoprene, polyethylene, or the like. In the example of FIG. 3, air baffle 315 is illustrated as having a square cross section. However, in other, further, and different examples, air baffle 315 may have a different cross-sectional profile, such as a rectangular, triangular, circular, trapezoidal, t-shaped, or other regular or irregular shaped profile. It should be noted that FIG. 3 illustrates a portion of an example panel 300, and that panel 300 may take a variety of different forms and may include various additional features and components not shown in the FIG. 3, such as additional columns of closed or open guides, and so forth.

It will be appreciated that variants of the above-disclosed and other features and functions, or alternatives thereof, may be combined into many other different systems or applications. Various presently unforeseen or unanticipated alternatives, modifications, or variations therein may be subsequently made, which are also intended to be encompassed by the following claims.

What is claimed is:

1. A drive cage panel for a drive cage, the drive cage panel comprising:
   a plurality of air inlet holes in a front face of the drive cage panel;
   a first plurality of guides on a surface of the drive cage panel, the first plurality of guides aligned with a drive region of the drive cage, the first plurality of guides arranged in a first column and open to the passage of air therethrough;
   a second plurality of guides on the surface of the drive cage panel, the second plurality of guides arranged in a second column parallel to the first column and closed to the passage of air therethrough, and
   a selectively removable air baffle selectively deployed on the surface of the drive cage panel between the first column of the first plurality of guides and the second column of the second plurality of guides, the air baffle to divert a flow of air from the plurality of air inlet holes to the drive region via the first plurality of guides when the air baffle is deployed on the surface of the drive cage panel;
   wherein the drive cage is tunable to provide various airflow configurations through selective deployment and removal of the selectively removable air baffle.

2. The drive cage panel of claim 1, wherein the selectively removable air baffle is to block the flow of air from the plurality of air inlet holes to a rear of the drive cage panel when deployed on the surface of the drive cage panel.

3. The drive cage panel of claim 1, wherein the drive cage panel is to pass the flow of air to a rear of the drive cage panel when the selectively removable air baffle is not deployed on the surface of the drive cage panel.

4. The drive cage panel of claim 3, wherein the rear of the drive cage panel is aligned to a backplane.

5. The drive cage panel of claim 1, wherein the plurality of guides is formed along a plurality of ridges on the surface of the drive cage panel, the plurality of ridges extending from a front of the drive cage panel to a rear of the drive cage panel.

6. The drive cage panel of claim 1, wherein the first and second columns of the first plurality of guides and the second plurality of guides, respectively, extend parallel to the front face of the drive cage panel, wherein the selectively removable air baffle is to divert the flow of air from the plurality of air inlet holes to a first portion of the drive region when deployed on the surface of the drive cage panel adjacent to a first column of the plurality of columns, and wherein the selectively removable air baffle is to divert the flow of air from the plurality of air inlet holes to a second portion of the drive region when deployed on the surface of the drive cage panel between the first and second columns.

7. The drive cage panel of claim 1,
wherein the first plurality of air guides comprise ridges protruding from the surface into the drive region and defining slots that are to receive modules, the air guides to guide the modules into installed positions as the modules are slid into the slots,
the ridges include openings through which the first flow of air passes as the first flow of air flows from the first plurality of air inlet holes to the drive region.

8. The drive cage panel of claim 7,
wherein the first plurality of air guides are such that, when modules are installed in the slots, the first flow of air flows through the openings in the ridges into a region between adjacent modules.

9. A drive cage, comprising:
a first panel, the first panel comprising:
a first plurality of air inlet holes in a front face of the first panel;
a first plurality of guides on a surface of the first panel, the first plurality of guides aligned with a drive region of the drive cage, the first plurality of guides arranged in a first column and open to the passage of air therethrough;
a second plurality of guides on the surface of the first panel, the first plurality of guides arranged in a second column parallel to the first column and closed to the passage of air therethrough; and
a first selectively removable air baffle selectively deployed on the surface of the first panel, the first selectively removable air baffle to divert a first flow of air from the first plurality of air inlet holes to the drive region via the first plurality of guides when deployed on the surface of the first panel; and
a second panel parallel to the first panel, the second panel comprising:
a second plurality of air inlet holes in a front face of the second panel;
a third plurality of guides on a surface of the second panel, the third plurality of guides aligned with the drive region of the drive cage, the third plurality of guides arranged in a third column and open to the passage of air therethrough;
a fourth plurality of guides on the surface of the second panel, the fourth plurality of guides arranged in a fourth column parallel to the third column and closed to the passage of air therethrough; and
a second selectively removable air baffle, selectively deployed on the surface of the second panel the second selectively removable air baffle to divert a second flow of air from the second plurality of air inlet holes to the drive region via the third plurality of guides when deployed on the surface of the second panel;
wherein the drive cage is tunable to provide various airflow configurations through selective deployment and removal of the first and second selectively removable air baffles.

10. The drive cage of claim 9, wherein the first plurality of guides comprises a first plurality of ridges on the surface of the first panel, the first plurality of ridges extending from a front of the first panel toward a rear of the first panel, wherein the third plurality of guides comprises a second plurality of ridges on the surface of the second panel, the second plurality of ridges extending from a front of the second panel toward a rear of the second panel.

11. The drive cage of claim 10, wherein the first panel and the second panel are to support a plurality of drive carriers on the first plurality of ridges and the second plurality of ridges.

12. The drive cage of claim 9, wherein the first panel is to pass the first flow of air to a rear of the first panel when the first selectively removable air baffle is not deployed on the surface of the first panel, and wherein the second panel is to pass the second flow of air to a rear of the second panel when the second selectively removable air baffle is not deployed on the surface of the second panel.

13. The drive cage of claim 9,
wherein the first plurality of guides comprise ridges protruding from the surface of the first panel into the drive region and the second plurality of guides comprise ridges protruding from the surface of the second panel into the drive region, the first and second pluralities of guides defining slots that are to receive modules and guiding the modules into installed positions as the modules are slid into the slots,
the ridges of the first plurality of guides include openings through which the first flow of air passes as the first flow of air flows from the first plurality of air inlet holes to the drive region; and
the ridges of the second plurality of guides include openings through which the second flow of air passes as the second flow of air flows from the second plurality of air inlet holes to the drive region.

14. A chassis comprising:
a backplane; and
at least one drive cage, the at least one drive cage for supporting a plurality of drive carriers, the at least one drive cage comprising at least one panel, the at least one panel comprising:
a plurality of air inlet holes in a front face of the at least one panel;
a plurality of guides on a surface of the at least one panel, the plurality of guides aligned with a drive region of the at least one drive cage, the plurality of guides arranged in a column and open to the passage of air therethrough; and
a selectively removable air baffle, selectively deployed on the surface of the at least one panel, the selectively removable air baffle to divert a flow of air from the plurality of air inlet holes to the drive region via the plurality of guides when deployed on the surface of the at least one panel and to pass the flow of air to the backplane when the selectively removable air baffle is not deployed on the surface of the at least one panel;

wherein the drive cage is tunable to provide various airflow configurations through selective deployment and removal of the selectively removable air baffle.

15. The chassis of claim 14, further comprising:
at least one input/output module coupled to the backplane, wherein the selectively removable air baffle is deployed on the surface of the at least one panel when the chassis includes the at least one input/output module.

16. The chassis of claim 14, further comprising:
at least one controller module coupled to the backplane, wherein the selectively removable air baffle is not deployed on the surface of the at least one panel when the chassis includes the at least one controller module.

17. The drive cage of claim 14,
wherein the plurality of guides comprise ridges protruding from the surface of the at least one panel into the drive region and defining slots that are to receive modules, the guides to guide the modules into installed positions as the modules are slid into the slots,
the ridges include openings through which the flow of air passes as the flow of air flows from the first plurality of air inlet holes to the drive region.

* * * * *